United States Patent [19]

Feller

[11] Patent Number: 4,922,403
[45] Date of Patent: May 1, 1990

[54] VOLTAGE MULTIPLIER CIRCUIT WITH REDUCED BACK-GATE BIAS EFFECT

[76] Inventor: Ernst Feller, Brunaustrasse 66, CH-8002 Zürich, Switzerland

[21] Appl. No.: 268,108

[22] Filed: Nov. 7, 1988

[30] Foreign Application Priority Data

Nov. 17, 1987 [NL] Netherlands .................. 8702734

[51] Int. Cl.$^5$ ........................................... H02M 7/25
[52] U.S. Cl. .................................. 363/60; 363/147; 357/41
[58] Field of Search .......................... 363/59-61, 363/126, 147; 320/1; 307/110; 357/40, 41

[56] References Cited

U.S. PATENT DOCUMENTS

| 4,061,929 | 12/1977 | Asano | 363/60 |
|---|---|---|---|
| 4,481,566 | 11/1984 | Hoffman et al. | 363/60 |
| 4,559,548 | 12/1985 | Iizuka et al. | 363/60 |
| 4,621,315 | 11/1986 | Vaughn et al. | 363/60 |

FOREIGN PATENT DOCUMENTS

| 0026419 | 2/1977 | Japan | 363/60 |
|---|---|---|---|
| 0014359 | 1/1984 | Japan | 363/60 |

OTHER PUBLICATIONS

Carr et al., "MOS/LSI Design and Application", McGraw-Hill, 1972, pp. 56-57.

Primary Examiner—Peter S. Wong
Attorney, Agent, or Firm—Bernard Franzblau

[57] ABSTRACT

A voltage multiplier includes a series connection of rectifier elements which are alternately rendered conductive by alternately applying complementary clock signals to capacitances which are connected to junction points of pairs of neighboring rectifier elements. The rectifier element is constructed by means of field effect transistors so that the well in the substrate in which the rectifier element is formed receives either the anode voltage or the cathode voltage. This prevents the occurrence of the so-called back-gate bias effect which increases the threshold voltage of the rectifier element and limits the output voltage of the voltage multiplier.

20 Claims, 3 Drawing Sheets

VOLTAGE MULTIPLIER CIRCUIT WITH REDUCED BACK-GATE BIAS EFFECT

This invention relates to an integrated voltage multiplier circuit comprising a high-voltage output connected to a series connection of rectifier elements, each of which comprises a first field effect transistor, a buffer capacitance for charge storage being connected between the high-voltage output and a power supply terminal, a junction point of every pair of neighboring elements being connected to one side of a booster capacitance to which clock signals are applied on the other side so that two booster capacitances connected to a respective side of one rectifier element receive clock signals of mutually opposed polarity.

The invention also relates to a rectifier element suitable for use in such a voltage multiplier circuit.

STATE OF THE ART

Voltage multiplier circuits of this kind are known, for example, from IEEE Solid State Circuits, SC-11(3), June 1976, page 375, and are used inter alia in non-volatile electrically programmable and erasable memories.

A conventional voltage multiplier circuit for generating a negative output voltage comprises a series connection of PMOS transistors which are connected as diodes and which are realized in a P-well process, said series connection being connected at a cathode side to a point carrying a low supply voltage $V_{SS}$ (ground) and comprising at an anode side an output with a buffer capacitance for supplying a high programming voltage. The buffer capacitance is connected between the output and a high supply voltage $V_{DD}$. The substrate in which these transistors are embedded is of the N-type and, in order to avoid the injection of charge carriers from the transistors to the substrate, it is coupled to the high supply voltage ($V_{DD}$). A junction point of each pair of neighbouring diodes is connected, via a respective booster capacitance, to either a first clock line or a second clock line, which clock lines carry logically complementary clock signals. The various booster capacitances alternately receive clock signals of opposed sign. Because the sign of the clock signals periodically changes, the diodes are alternately conductive and blocked and charge is transferred from one booster capacitance to the other via a conductive diode.

It is a drawback of the conventional voltage multiplier circuit that, as a voltage on a booster capacitance or on the buffer capacitance becomes more negative due to the transfer of charge, the threshold voltage of the transistor which is connected to the relevant capacitance and which is connected as a diode increases due to the so-called back-gate bias effect. As a result, the ratio of the charge pumped through a rectifier element and the charge to be potentially transferred by means of a clock signal is reduced. The effectiveness of the unit, booster capacitance and rectifier element, decreases. In this respect reference is made to "MOS/LSI Design and Application", W. Carr and J. Mize, McGraw-Hill, 1972, pp. 56-57.

The level of the output voltage of the voltage multiplier circuit is limited by this effect. The transfer of charge from the buffer capacitance, via the diode, to the next booster capacitance stops when the voltage swing between the clock lines is too small to raise the voltage on the anode of the diode one threshold voltage beyond the voltage on the cathode of the diode. In order to obtain a higher negative output voltage, a larger voltage swing and hence a higher supply voltage would be required.

Replacement of a PMOS transistor by an NMOS transistor connected as a diode and also realized by means of a P-well process, leads to problems of another kind. The P-well contact of the transistor is connected to the anode side of the diode. Consequently, the cathode, the P-well and the substrate form an emitter, a base and a collector, respectively, of a parasitic npn transistor which draws current from the substrate. For example, International Patent Application PCT/US 83/01977, publication No. WO 84/02607, discloses a solution to this problem, involving an auxiliary voltage multiplier which keeps all wells at a sufficiently low negative voltage. The auxiliary multiplier, however, requires an additional amount of substrate surface area, increases the power dissipation and necessitates additional steps so as to reduce the effect of the parasitic transistors which are then present.

The above considerations also hold true for conventional voltage multiplier circuits for achieving a high positive output voltage by means of NMOS transistors in a P-well process, and also for voltage multiplier circuits realized by means of MOS transistors in an N-well process.

SUMMARY OF THE INVENTION

It is an object of the invention to provide a voltage multiplier circuit incorporating a more effective voltage multiplication, where the output voltage is not limited by the back-gate bias effect or by the level of the supply voltage, and where conduction of the parasitic bipolar transistors is avoided.

To achieve this, a voltage multiplier circuit in accordance with the invention is characterized in that the field effect transistors of the elements on a substrate are realized in separate regions (e.g. wells) of a conductivity type other than that of the substrate, at least the rectifier elements which are situated at a high-voltage side of the circuit comprising respective switching means which connect internal diodes, formed in the field effect transistor by a p-n junctions between a source and a drain, respectively, of the field effect transistor on the one side and the region (e.g. well) on the other side, to either the source in the conductive state or to the drain in the blocked state of the field effect transistor, so that the internal diodes remain blocked. When the region is connected to the source of the field effect transistor in the conductive state of the latter, the back-gate bias voltage remains zero. When the region is connected to the drain of the field effect transistor in the blocked state of the latter, the parasitic bipolar transistor whose collector, base and emitter are formed by the substrate, the well and the drain, respectively, will not become conductive.

EMBODIMENTS OF THE INVENTION

An embodiment of a voltage multiplier circuit in accordance with the invention is characterized in that the switching means of the first field effect transistor comprise a second and a third field effect transistor which are of the same conductivity type as the first field effect transistor and which are realized in respective regions which are coupled to the region of the first field effect transistor, a source of the second and the third field effect transistor being connected to a source and a drain, respectively, of the first field effect transistor, a control electrode of the second and the third field effect transistor being coupled to the drain and the source, respectively, of the first field effect transistor, the drains of the second and the third transistor being connected to the interconnected regions. The switching means in the form of a second and third transistor have a compact construction and need not be driven by additional control signals. Such a construction comprising NMOS transistors in a P-well is suitable for generating high negative voltages. A voltage multiplier constructed by means of PMOS transistors is suitable for generating high positive voltages.

A further embodiment of a voltage multiplier circuit in accordance with the invention is characterized in that the voltage multiplier circuit comprises a multi-phase clock signal generator for applying respective, mutually phase-shifted clock signals to respective booster capacitances, the clock signal applied to the source of the first field effect transistor via the relevant booster capacitance changing sooner than the complementary clock signal applied to the drain of the first field effect transistor via the next booster capacitance. When a voltage across the first transistor is smaller than a threshold voltage, the regions are uncoupled from the main electrodes of the first transistor. The regions, however, retain the voltage they had at the instant of uncoupling because the junction capacitance of the well has been charged.

When the voltage on the source is made to rise or decrease before the voltage on the drain of the first transistor decreases or increases, respectively, by applying phase-shifted, complementary clock signals to said main electrodes via the relevant booster capacitances, the bipolar parasitic transistor whose collector, base and emitter are formed by the substrate, the well and the source of the first transistor, respectively, will not become conductive.

A further embodiment of a voltage multiplier circuit in accordance with the invention is characterized in that the multi-phase clock signal generator comprises a series connection of a number of inverter circuits, respective outputs of two neighbouring inverter circuits being connected to respective electrodes of two neighbouring booster capacitances. The clock signal generator then comprises a series connection of inverter circuits for applying clock signals to the neighbouring booster capacitances in phase opposition, a gate delay of an inverter circuit causing the above-mentioned phase shift.

A preferred embodiment of a voltage multiplier circuit in accordance with the invention is characterized in that in the element between a connection point of the control electrode of the first and the second field effect transistor on the one side and the drain of the first field effect transistor on the other side, there is provided a switchable charging or discharging path for charging or discharging the latter control electrodes. Control means are provided which are connected to the latter connection point via a coupling capacitance in order to increase or decrease a voltage on the latter control electrodes after they have been charged or discharged, respectively, via the switchable charging or discharging path. The voltage across the first field effect transistor is thus reduced to substantially zero in the forward direction because no threshold loss occurs. This threshold loss is avoided by adding to the control voltage already present on the control electrode of the first transistor, via the coupling capacitance, a control voltage originating from the control means.

Another embodiment of a voltage multiplier circuit in accordance with the invention, in which the series connection of inverter circuits forms a part of a ring oscillator, is characterized in that the ring oscillator comprises a flipflop, having an output which is fed back, via the inverters, to a first flipflop input, a second flipflop input receiving an enable signal. Because a flipflop is included in the ring oscillator, the ring oscillator can be switched off after a complete last clock pulse.

BRIEF DESCRIPTION OF THE DRAWINGS

The invention will be described in detail hereinafter with reference to the accompanying drawing; which.

CONVENTIONAL VOLTAGE MULTIPLIER CIRCUIT

Figure 1:
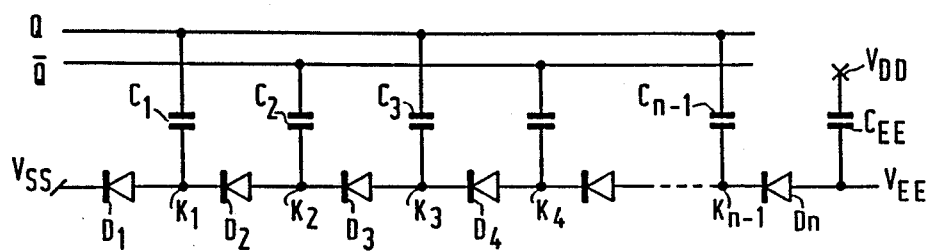
FIG. 1 shows an example of a conventional voltage multiplier circuit.

FIG. 1 shows a conventional voltage multiplier circuit of the type generating a negative output voltage. Between the power supply terminal $V_{SS}$ and the output $V_{EE}$ there is arranged a series connection of rectifier elements $D_1, D_2, \ldots D_n$. Between the output $V_{EE}$ and the power supply terminal $V_{DD}$ there is connected a buffer capacitance $C_{EE}$. The respective junctions $K_1, K_2, \ldots, K_{n-1}$ are alternately connected, via an associated booster capacitance $C_1, C_2, \ldots, C_{n-1}$, to clock lines $Q$ and $\overline{Q}$ which carry complementary clock signals. Because the clock signals $Q$ and $\overline{Q}$ are periodic, the rectifier elements having an even index, $D_2, D_4, \ldots$, and the elements having an odd index $D_1, D_3, \ldots$, will periodically be blocked or conductive and conductive or blocked, respectively. Charge is then pumped, via a conductive element, from one booster capacitance to the next booster capacitance having a lower index. Charge is thus step-wise fetched from the buffer capacitance $C_{EE}$ and ultimately drained on the $V_{SS}$ terminal.

CONVENTIONAL RECTIFIER ELEMENTS

Figure 2A:
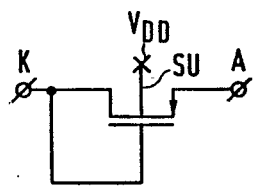
FIGS. 2a, b and c show rectifier elements of the voltage multiplier circuit shown in FIG. 1.

FIGS. 2a and b show conventional rectifier elements for a voltage multiplier circuit as shown in FIG. 1 which is constructed by means of field effect transistors. The element shown in FIG. 2a is a PMOS transistor which is connected as a diode and a substrate connection SU of which is connected to the positive supply terminal $V_{DD}$ in order to avoid charge injection to the substrate. At the anode side A of the element shown, there will be a higher negative voltage as this element is situated nearer to the output $V_{EE}$ in the series connection shown in FIG. 1. Because of the higher substrate-source voltage in such an element, the threshold voltage at which the element becomes conductive is also higher. This is because the threshold voltage increases as the substrate-source voltage increases. When a given substrate-source voltage is reached, the threshold voltage of the rectifier element becomes so high that the voltage swing on the clock lines Q and $\overline{Q}$ is no longer sufficient to raise the voltage difference across the element $D_n$ in the forward direction beyond the threshold voltage of the transistor.

Figure 2B:
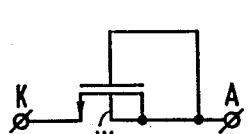
Figure 2C:
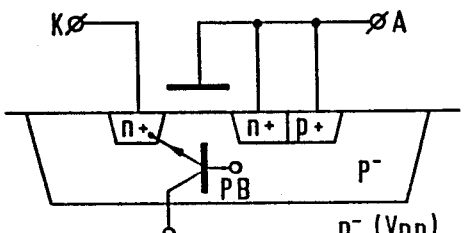

The element shown in the FIGS. 2b and 2c is an NMOS transistor which is connected as a diode and which is realized in a P-well. The well connection W is connected to the anode A in order to prevent charge injection to the well. If the voltage on the side of the cathode K is lower than that on the anode side, a parasitic bipolar transistor PB is set to the conductive state.

DESCRIPTION OF THE PREFERRED EMBODIMENTS

Circuit Diagram of a Rectifier Element in Accordance With the Invention

Figure 3:
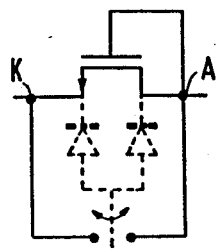
FIG. 3 shows a circuit diagram of a rectifier element for a voltage multiplier circuit in accordance with the invention.

FIG. 3 shows a circuit diagram of a rectifier element in accordance with the invention. The invention is based on the recognition of the fact that the element shown in FIGS. 2b and 2c is suitable as a rectifier element for the voltage multiplier circuit shown in FIG. 1 only if the voltage on the cathode terminal K cannot drop below that of the well and hence below that on the anode terminal A, so that the parasitic transistor PB becomes conductive. If the well connection according to the invention is always switched to the main electrode of the NMOS transistor which carries the lowest voltage, the problem described with reference to FIG. 2c is solved. This is shown in FIG. 3. In the transistor the diodes between the N diffusions for the main electrodes on the one side and the P-well on the other side are connected, depending on the voltage on the cathode K and the anode A, to either the cathode terminal K or to the anode terminal A, so that the diodes are always blocked.

First Embodiment of a Rectifier Element

Figure 4:
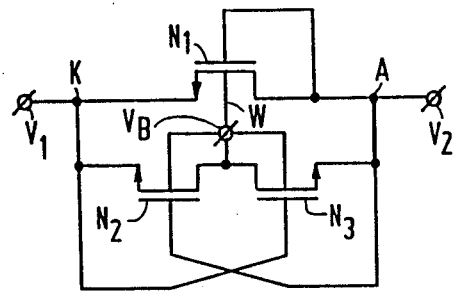
FIG. 4 shows a first embodiment of a rectifier element for a voltage multiplier circuit in accordance with the invention.

FIG. 4 shows a first embodiment of a rectifier element for a voltage multiplier circuit in accordance with the invention. A P-well terminal W of a first NMOS transistor $N_1$ which is connected as a diode is coupled to the cathode K of the transistor $N_1$ across a second transistor $N_2$ and to the anode A of the transistor $N_1$ across a third transistor $N_3$. The coupling of the control electrodes of the transistor $N_2$ and of the transistor $N_3$ to the anode A and the cathode K, respectively, of the transistor $N_1$ ensures that the P-well is always connected to the lowest voltage occurring on one of the main electrodes of the transistor $N_1$, except when the voltage across the transistor $N_1$ is lower than a threshold voltage of the transistors $N_2$ and $N_3$. In that case the P-well is uncoupled from the anode A as well as from the cathode K. However, the P-well maintains its voltage on the junction capacitance between the P-well and the substrate. In order to prevent the parasitic bipolar transistor PB as shown in FIG. 2c from becoming conductive due to the voltage on the junction capacitance, the voltage on the source of the transistor $N_1$ (junction K) must change before that on the drain (junction A). This will be described in detail hereinafter with reference to FIGS. 5 and 6.

First Embodiment of a Voltage Multiplier Circuit

Figure 5:
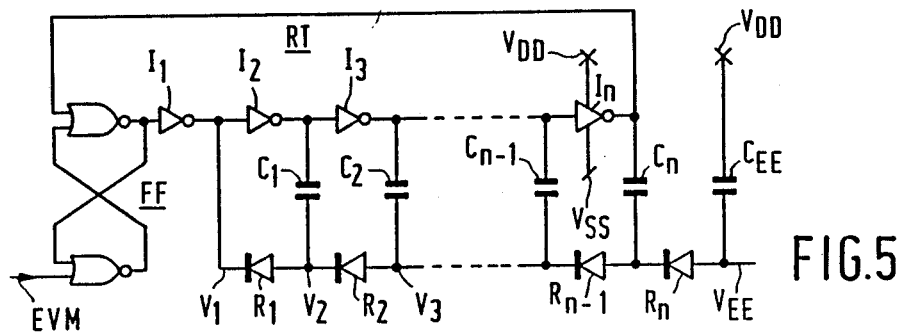
FIG. 5 shows a first embodiment of a voltage multiplier circuit in accordance with the invention.

FIG. 5 shows a first embodiment of a voltage multiplier circuit in accordance with the invention. This voltage multiplier circuit generates a negative output voltage $V_{EE}$. The series connection of the rectifier elements of the type described with reference to FIG. 4, $R_1, R_2, \ldots, R_n$, is connected to a power supply terminal $V_{DD}$ at an anode side, via a buffer capacitance $C_{EE}$. Each of the junctions between two elements is connected, via booster capacitances, to a junction point between two inverters $I_2, I_3, \ldots, I_n$. The series connection of the inverters forms part of a ring oscillator RT which also includes a flipflop FF. The successive booster capacitances $C_1, C_2, \ldots, C_{n-1}$ receive clock signals in phase opposition, as has already been described with reference to FIG. 1. Moreover, the clock signals applied to the successive booster capacitances are delayed with respect to one another by a time interval which equals one inverter delay. This inverter delay ensures that the voltage on the source (for example, the junction $V_2$) of the first transistor in an element (for example, $R_2$) changes before the voltage on the drain (for example, junction point $V_3$) of said first transistor changes. As has already been stated, this serves to prevent parasitic bipolar transistors from becoming conductive in blocked rectifier elements, thus disturbing the potential built up at said rectifier element. Flipflop FF is included in the ring oscillator RT in order to ensure that, when the ring oscillator is switched off by means of the enable signal EVM, the last clock pulse is still fully passed on, resulting in better defined states in the oscillator.

Signal Variations

Figure 6A:
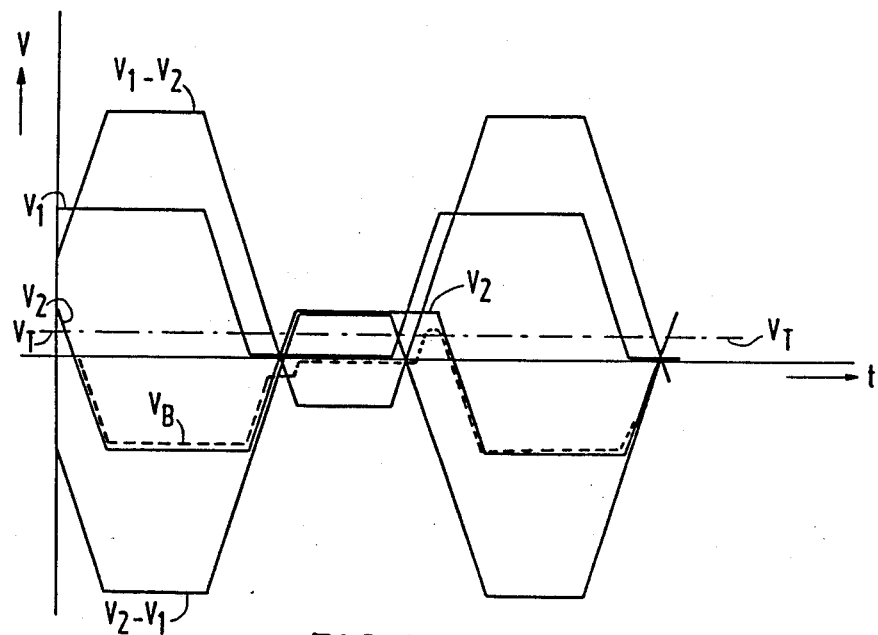
FIGS. 6a and 6b show variations of signal voltages in the rectifier element as shown in FIG. 4, used in a voltage multiplier circuit as shown in FIG. 5.
Figure 6B:
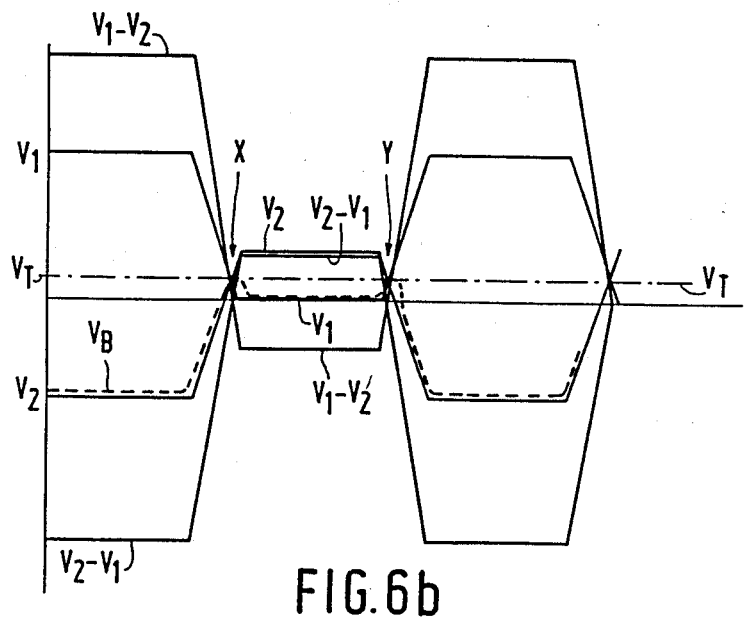

FIG. 6a shows the variation of the voltages denoted by the references $V_1$ and $V_2$ in FIG. 5 and the references $V_1$, $V_2$ and $V_B$ in FIG. 4. FIG. 6b shows the variation of these signals if the signals on the source of the first transistor in an element were to change simultaneously with the signals on its drain. Signal $V_1$ is the signal on the source of the transistor $N_1$ of FIG. 4 and $V_2$ is the signal on the drain of the transistor $N_1$. The signal $V_2$ has a lower mean value than $V_1$ because charge is stepwise drained from the buffer capacitance $C_{EE}$, having a high negative voltage, across the various stage capacitances $C_1, C_2, \ldots, C_n$, to $V_{SS}$. The transistor $N_2$ of FIG. 4 receives a control voltage $V_2-V_1$ and the transistor $N_3$ receives a control voltage $V_1-V_2$. These control voltages are also shown in FIGS. 6a and 6b. When a control voltage exceeds a threshold $V_T$, the relevant transistor is conductive. A variation of the voltage $V_B$ of the P-well can thus be simply illustrated. When both said control voltages drop below the threshold $V_T$, the well is uncoupled from the main electrodes of the transistor $N_1$. However, the well maintains its voltage because of the charge stored on its junction capacitance. Signal $V_B$ remains below or equal to one of the voltages $V_1$ and $V_2$ throughout FIG. 6a in which the signal $V_2$ is delayed with respect to $V_1$. For the sake of clarity, the actually coincident line segments are shown to be slightly separated in the drawing, but this has no significance. In FIG. 6b, however, where $V_1$ and $V_2$ change their sign simultaneously, the arrow X denotes the voltage variation where $V_B$ exceeds $V_1$ and the arrow Y denotes the voltage variation where $V_B$ exceeds $V_2$. In both situations the previously mentioned parasitic bipolar transistor becomes conductive and undesirable loss of charge occurs.

Preferred Embodiment of a Rectifier Element

Figure 7:
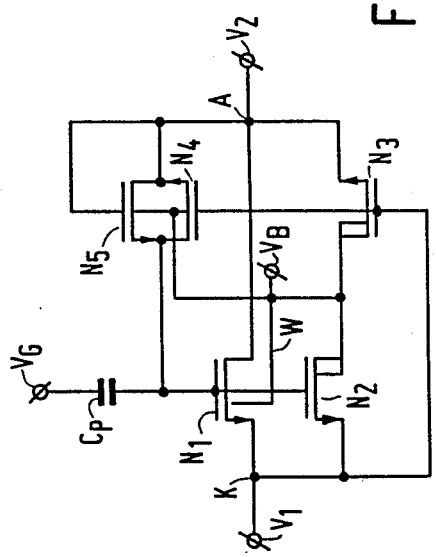
FIG. 7 shows a second embodiment of a rectifier element for a voltage multiplier circuit in accordance with the invention.

FIG. 7 shows a preferred embodiment of a rectifier element for an integrated voltage multiplier circuit in accordance with the invention. Parts which correspond to those shown in FIG. 4 are denoted by corresponding reference numerals. The rectifier transistor $N_1$ and the second transistor $N_2$ are no longer controlled by the forward voltage on the junction point A, as was the case in the circuit shown in FIG. 4. The connection between the drain of $N_1$ and the control electrode of $N_1$ is now formed by a current path which can be switched on and off and which comprises a gate transistor $N_5$ which is connected as a diode and a gate transistor $N_4$ which is connected thereto in anti-parallel and which is controlled by a voltage on the junction point K. When the voltage $V_2$ on the junction point A increases and the voltage $V_1$ on the junction point K decreases, first the control electrodes of the rectifier transistor $N_1$ and of the second transistor $N_2$ will receive a control voltage via the gate transistor $N_5$. Only after that will an additional control voltage $V_G$ in the form of a pulse be added to the control voltage already present, via a coupling capacitance $C_p$. The control voltage for the transistor $N_1$ then increases by such an amount with respect to the voltage $V_2$ that no threshold losses occur across the transistor $N_1$ and the voltage $V_1$ in principle becomes equal to $V_2$. When the voltage $V_1$ subsequently increases again, the charge on the control electrode of the transistor $N_1$ is drained again via the gate transistor $N_4$. Such an element is suitable for use in the voltage multiplier circuit as described with reference to the next Figure.

Preferred Embodiment of a Voltage Multiplier Circuit

Figure 8:
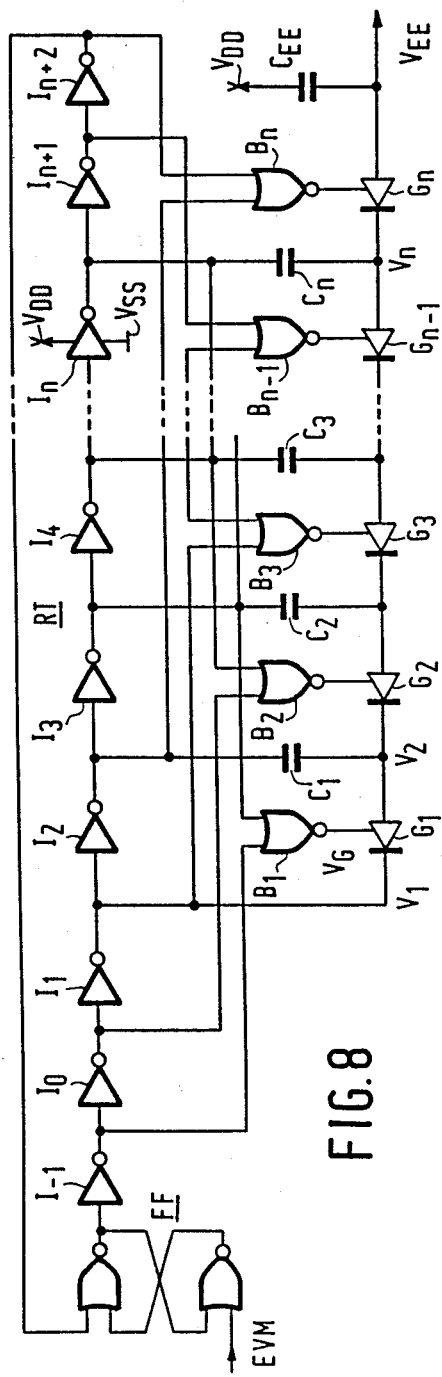
FIG. 8 shows a second embodiment of a voltage multiplier circuit in accordance with the invention.

FIG. 8 shows a second embodiment of a voltage multiplier circuit in accordance with the invention. Parts which correspond to those shown in FIG. 5 are denoted by corresponding reference numerals. The series connection of rectifier elements $G_1, G_2, \ldots, G_n$ now comprises rectifier elements of the type shown in FIG. 7. Each of these elements $G_1, G_2, \ldots, G_n$ comprises an additional control input coupled to an associated NOR-gate $B_1, B_2, \ldots, B_n$. An output of such a NOR-gate supplies the pulse signal $V_G$, described with reference to FIG. 7, on the coupling capacitance $C_p$. The operation will be described with reference to the element $G_1$ of FIG. 8 which is explicitly shown in FIG. 7. When the voltage $V_2$ exceeds the voltage $V_1$, the transistor $N_4$ is blocked. The NOR-gate $B_1$ initially supplies an output signal equal to $V_{SS}$. When the voltage $V_2$ increases, the control electrode of the transistor $N_1$ is raised to a higher voltage via the source follower $N_5$. When subsequently the full forward voltage $V_2-V_1$ has been built up across the transistor $N_T$, the NOR-gate $B_1$ switches the output signal from $V_{SS}$ to $V_{DD}$, thus pressing, via the coupling capacitance $C_p$, the voltage on the control electrode of the transistor $N_1$ beyond the voltage $V_2$. Consequently, the transistor $N_1$ will no longer cause threshold voltage losses ($V_1=V_2$). At the end of this charging operation, the NOR-gate $B_1$ changes over from $V_{DD}$ to $V_{SS}$, after which the reverse voltage $V_1-V_2$ is built up across the transistor $N_1$. The correct phase for driving the elements via the NOR-gate is derived from the voltages on the inputs and outputs of the inverters $I_{-1}, I_0, I_1, \ldots, I_{n-2}$ of the ring oscillator.

What is claimed is:

1. An integrated voltage multiplier circuit comprising a high-voltage output connected to a series connection of rectifier elements each of which comprises a first field effect transistor, a buffer capacitance for charge storage being connected between the high-voltage output and a power supply terminal, a junction point of every pair of neighboring rectifier elements being connected to one side of a respective booster capacitance to which clock signals are applied such so that two booster capacitances connected to respective sides of one rectifier element receive clock signals of mutually opposed polarity, characterized in that the field effect transistors of the elements on a substrate comprise separate regions of a conductivity type other than that of the substrate, at least the rectifier elements situated closest electrically to a high-voltage side of the circuit comprising respective switching means which connect internal diodes, formed in the respective first field effect transistor by p-n junctions between a source and a drain, respectively, on the one side and the region on the other side, to the source in the conductive state and to the drain in the blocked state of the first field effect transistor, so that said internal diodes remain blocked.

2. An integrated voltage multiplier circuit as claimed in claim 1, wherein the switching means of the first field effect transistor comprise a second and a third field effect transistor of the same conductivity type as the first field effect transistor and which are formed in respective regions which are coupled to the region of the first field effect transistor, a source of the second and the third field effect transistor being connected to a source and a drain, respectively, of the first field effect transistor, a control electrode of the second and the third field effect transistor being coupled to the drain and the source, respectively, of the first field effect transistor, and drains of the second and the third transistor being connected to the coupled regions.

3. An integrated voltage multiplier circuit as claimed in claim 2, wherein the voltage multiplier circuit comprises a multi-phase clock signal generator for applying respective, mutually phase-shifted clock signals to respective booster capacitances, the clock signal applied to the source of the first field effect transistor via the relevant booster capacitance changing sooner than the complementary clock signal applied to the drain of the first field effect transistor via a next booster capacitance.

4. An integrated voltage multiplier circuit as claimed in claim 3, wherein the multi-phase clock signal generator comprises a series connection of a number of inverter circuits, respective outputs of two neighboring inverter circuits being connected to respective electrodes of two neighboring booster capacitances.

5. An integrated voltage multiplier circuit as claimed in claim 4, wherein the output and input of the last inverter circuit of the series connection are connected respectively to an electrode of the booster capacitance that is connected to one side of a last rectifier element, the other side of which rectifier element forms the output of the voltage multiplier, and to the neighboring booster capacitance which is connected to the last rectifier element but one.

6. An integrated voltage multiplier circuit as claimed in claim 1 in combination with an electrically programmable and erasable memory.

7. An integrated voltage multiplier circuit as claimed in claim 2, further comprising a connection point between the control electrodes of the first and the second field effect transistor, a switchable charging or discharging path coupling said connection point to the drain of the first field effect transistor for charging or discharging the control electrodes of the first and second field effect transistors, and control means connected to said connection point via a coupling capacitance in order to increase or decrease a voltage on the control electrodes of the first and second field effect transistors after they have been charged or discharged, respectively, via the charging or discharging path.

8. An integrated voltage multiplier circuit as claimed in claim 7 wherein the charging or discharging path comprises a fourth and a fifth field effect transistor, of the same conductivity type as the first field effect transistor and being formed in respective regions which are coupled to that of the first field effect transistor, a drain and a control electrode of the fourth field effect transistor being connected to the drain of the first field effect transistor, a source of the fourth field effect transistor being connected to the connection point of the control electrodes of the first and the second field effect transistor, a drain of the fifth field effect transistor being connected to said connection point and a source and a control electrode of the fifth field effect transistor being connected to the drain and the source, respectively, of the first field effect transistor.

9. An integrated voltage multiplier circuit as claimed in the claim 7, wherein the control means comprise a logic gate having a gate output connected to the coupling capacitance and respective gate inputs connected between the inverter circuits.

10. An integrated voltage multiplier circuit as claimed in claim 9, characterized in that, when the respective elements are constructed by means of NMOS transistors in respective P-wells, the logic gate is a NOR-gate having a gate output connected to the coupling capacitance, a first gate input for receiving a clock signal two inverter delays sooner than the source of the first field effect transistor, and a second gate input for receiving a clock signal two inverter delays later than the source of the first field effect transistor.

11. An integrated voltage multiplier circuit as claimed in claim 9, characterized in that, when the respective elements are constructed by means of PMOS transistors in respective N-wells, the logic gate is a NAND-gate having a gate output connected to the coupling capacitance, a first gate input for receiving a clock signal two inverter delays before the source of the first field effect transistor, and a second gate input for receiving a clock signal two inverter delays later than the source of the first field effect transistor.

12. An integrated voltage multiplier circuit as claimed in claim 3, further comprising a connection point between the control electrodes of the first and the second field effect transistor, a switchable charging or discharging path coupling said connection point to the drain of the first field effect transistor for charging or discharging the control electrodes of the first and second field effect transistors, and control means connected to said connection point via a coupling capacitance in order to increase or decrease a voltage on the control electrodes of the first and second field effect transistors after they have been charged or discharged, respectively, via the charging or discharging path.

13. An integrated voltage multiplier circuit as claimed in claim 12, wherein the charging or discharging path comprises a fourth and a fifth field effect transistor of the same conductivity type as the first field effect transistor and being formed in said region of the first field effect transistor, a drain and a control electrode of the fourth field effect transistor being connected to the drain of the first field effect transistor, a source of the fourth field effect transistor being connected to the connection point of the control electrodes of the first and the second field effect transistor, a drain of the fifth field effect transistor being connected to said connection point and a source and a control electrode of the fifth field effect transistor being connected to the drain and the source, respectively, of the first field effect transistor.

14. An integrated voltage multiplier circuit as claimed in claim 4, wherein the series connection of inverter circuits forms part of a ring oscillator.

15. An integrated voltage multiplier circuit as claimed in claim 14, wherein the ring oscillator comprises a flipflop having an output fed back, via the inverters, to a first flipflop input, and a second flipflop input for receiving an enable signal.

16. An integrated voltage multiplier circuit as claimed in claim 4 further comprising a connection point between the control electrodes of the first and the second field effect transistor, a switchable charging or discharging path coupling said connection point to the drain of the first field effect transistor for charging or discharging the control electrodes of the first and second field effect transistors, and control means connected to said connection point via a coupling capacitance in order to increase or decrease a voltage on the control electrodes of the first and second field effect transistors after they have been charged or discharged, respectively, via the charging or discharging path, and wherein the control means comprise a logic gate having a gate output connected to the coupling capacitance and respective gate inputs connected between the inverter circuits.

17. An integrated rectifier element for use in a voltage multiplier circuit comprising:
  a substrate of a given conductivity type, separate regions of a conductivity type other than that of the substrate,
  at least one of said regions including a first field effect transistor comprising a source region and a drain region connected to respective electrodes of the first field effect transistor,
  a control region of said first field effect transistor being connected to one of said source and drain regions,
  first and second internal diodes being formed in the first field effect transistor by p-n junctions between said source and drain regions and the one region, and
  switching means including second and third field effect transistors which respectively connect said first and second internal diodes to the source electrode in the conductive state and the drain electrode in the blocked state of the first field effect transistor whereby the internal diodes remain blocked.

18. An integrated rectifier element as claimed in claim 17 wherein said second and third field effect transistors are of the same conductivity type as the first field effect transistor and are formed in said one region, a source region of the second field effect transistor and a source region of the third field effect transistor being connected to said source region and said drain region, respectively, of the first field effect transistor, a control region of the second field effect transistor and a control region of the third field effect transistor being coupled to the drain electrode and the source electrode, respectively, of the first field effect transistor, and means connecting drain regions of the second and third field effect transistors to said one region.

19. An integrated rectifier element as claimed in claim 18 wherein, said control region of the first field effect transistor is connected to its drain region via a switchable charge or discharge path, said control regions of the first and second field effect transistors being connected together to form a connection point so that said control regions are charged and discharged together via said charge and discharge path, respectively, and a coupling capacitance for coupling said connection point to a control means which increase and decrease the voltage on said control regions after they are charged and discharged, respectively, via the charge path and the discharge path.

20. An integrated rectifier element as claimed in claim 19 wherein, said charge path and said discharge path comprise fourth and fifth field effect transistors, respectively, of the same conductivity type as the first field effect transistor and formed in respective regions coupled to the one region of the first field effect transistor, a drain and a control region of the fourth field effect transistor being connected to the drain region of the first field effect transistor, a source region of the fourth field effect transistor being connected to the connection point of the control regions of the first and second field effect transistor, a drain region of the fifth field effect transistor being connected to said connection point and a source region and a control region of the fifth field effect transistor being connected to the drain region and the source region, respectively, of the first field effect transistor.

* * * * *